US012236893B2

(12) United States Patent
Hwang et al.

(10) Patent No.: US 12,236,893 B2
(45) Date of Patent: Feb. 25, 2025

(54) DISPLAY DEVICE USING CLOCKS HAVING DIFFERENT FREQUENCIES FOR DIFFERENT DISPLAY AREAS

(71) Applicant: Samsung Display Co., LTD., Yongin-si (KR)

(72) Inventors: Moonsang Hwang, Seoul (KR); Kyoungju Shin, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/321,099

(22) Filed: May 22, 2023

(65) Prior Publication Data

US 2024/0013730 A1 Jan. 11, 2024

(30) Foreign Application Priority Data

Jul. 5, 2022 (KR) .................. 10-2022-0082795

(51) Int. Cl.
*G09G 3/3266* (2016.01)
*G09G 3/3233* (2016.01)
(Continued)

(52) U.S. Cl.
CPC ......... *G09G 3/3266* (2013.01); *G09G 3/3233* (2013.01); *G09G 3/20* (2013.01);
(Continued)

(58) Field of Classification Search
CPC ...... G09G 3/3266; G09G 3/3233; G09G 3/20; G09G 3/3674; G09G 2300/0819; G09G 2300/0842; G09G 2300/0861; G09G 2310/0251; G09G 2310/0262; G09G 2310/0267; G09G 2310/0286;
(Continued)

(56) References Cited

U.S. PATENT DOCUMENTS 9,779,664 B2 10/2017 Wang et al.
2017/0025068 A1* 1/2017 Jeoung ................. G09G 3/3266
(Continued)

FOREIGN PATENT DOCUMENTS

KR 10-2016-0141132 12/2016
KR 10-2020-0120835 10/2020
(Continued)

*Primary Examiner* — Adam J Snyder
(74) *Attorney, Agent, or Firm* — KILE PARK REED & HOUTTEMAN PLLC

(57) ABSTRACT

A display device includes a display panel including pixels, and a first gate driver including first stages that output first carry signals, respectively, and first buffers that output first gate signals, respectively, and providing the first gate signals to the pixels. In case that the display panel includes a first display area and a second display area, the pixels disposed in the first display area are driven at a first frequency, and the pixels disposed in the second display area are driven at a second frequency; a first gate signal among the first gate signals output from a first buffer corresponding to the first display area is provided to the pixels disposed in the first display area, a first buffer corresponding to the second display area does not output the first gate signal, and the first gate signal is not provided to the pixels disposed in the second display area.

19 Claims, 10 Drawing Sheets

(51) Int. Cl.
*G09G 3/20* (2006.01)
*G09G 3/36* (2006.01)
*G11C 19/00* (2006.01)
*G11C 19/28* (2006.01)

(52) U.S. Cl.
CPC ... *G09G 3/3674* (2013.01); *G09G 2300/0819* (2013.01); *G09G 2300/0842* (2013.01); *G09G 2300/0861* (2013.01); *G09G 2310/0251* (2013.01); *G09G 2310/0262* (2013.01); *G09G 2310/0267* (2013.01); *G09G 2310/0286* (2013.01); *G09G 2310/0291* (2013.01); *G09G 2310/04* (2013.01); *G09G 2310/08* (2013.01); *G09G 2320/043* (2013.01); *G09G 2320/045* (2013.01); *G09G 2320/0686* (2013.01); *G09G 2330/021* (2013.01); *G09G 2340/04* (2013.01); *G09G 2340/0435* (2013.01); *G11C 19/00* (2013.01); *G11C 19/28* (2013.01)

(58) Field of Classification Search
CPC ....... G09G 2310/0291; G09G 2310/04; G09G 2310/08; G09G 2320/043; G09G 2320/045; G09G 2330/021; G09G 2340/04; G09G 2340/0435; G09G 2320/0686; G11C 19/28
See application file for complete search history.

(56) References Cited

U.S. PATENT DOCUMENTS

| | | | |
|---|---|---|---|
| 2018/0197455 A1* | 7/2018 | Han | G09G 3/3677 |
| 2021/0027707 A1* | 1/2021 | Park | G09G 3/3266 |
| 2021/0110774 A1* | 4/2021 | Cho | G09G 3/3266 |

FOREIGN PATENT DOCUMENTS

| | | |
|---|---|---|
| KR | 10-2021-0013505 | 2/2021 |
| KR | 10-2022-0000023 | 1/2022 |

* cited by examiner

DISPLAY DEVICE USING CLOCKS HAVING DIFFERENT FREQUENCIES FOR DIFFERENT DISPLAY AREAS

CROSS-REFERENCE TO RELATED APPLICATION(S)

This application claims priority to and benefits of Korean Patent Application No. 10-2022-0082795 under 35 USC § 119 filed on Jul. 5, 2022 in the Korean Intellectual Property Office, the entire contents of which are incorporated herein by reference.

BACKGROUND

1. Technical Field

The disclosure relates to a display device including a gate driver.

2. Description of the Related Art

Flat panel display devices are used as display devices for replacing a cathode ray tube display device due to light-weight and thin characteristics thereof. As representative examples of such flat panel display devices, there is a liquid crystal display device, an organic light emitting display device, a quantum dot display device, and the like.

Recently, a display device that may be driven at various frequencies has been developed, and in order to increase efficiency of a battery included in the display device, there is a demand for reduction of power consumption of pixels included in the display device. In order to reduce the power consumption of the pixels, in case that the pixels are driven at a low frequency (or in case that a still image is displayed), a driving frequency of the pixels may be reduced to drive the display device at a low frequency.

A display device in which a display area of the display device is divided to simultaneously display a first display area for displaying an image and a second display area for displaying a still image has been developed. The first display area and the second display area may be determined in case that the display device is manufactured, and a circuit configuration of a gate driver may be determined based on the first display area and the second display area. In other words, positions of the first display area and the second display area determined in case that the display device is manufactured may not be changed.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device.

According to embodiments, a display device may include a display panel including pixels; and a first gate driver including first stages that output first carry signals, respectively, and first buffers that output first gate signals, respectively, and that provide the first gate signals to the pixels. In case that the display panel includes a first display area and a second display area, in case that the pixels disposed in the first display area are driven at a first frequency, and in case that the pixels disposed in the second display area are driven at a second frequency, the first gate signal output from a first buffer corresponding to the first display area among the first buffers may be provided to the pixels disposed in the first display area, a first buffer corresponding to the second display area among the first buffers may not output the first gate signal, and the first gate signal may not be provided to the pixels disposed in the second display area.

In embodiments, a size or a position of each of the first display area and the second display area may be changeable.

In embodiments, the second frequency may be lower than the first frequency.

In embodiments, the first frequency may be greater than or substantially equal to about 100 Hz, and the second frequency may be less than or substantially equal to about 30 Hz.

In embodiments, the pixels may be defined as first to $m^{th}$ pixel rows, the first display area may correspond to first to $j^{th}$ pixel rows, among the first to $m^{th}$ pixel rows, and the second display area may correspond to $(j+1)^{th}$ to $m^{th}$ pixel rows among the first to $m^{th}$ pixel rows, wherein j is an integer between 1 and m, and m is an integer greater than 1.

In embodiments, the display panel may include a third display area, the third display area may be driven at a third frequency, and the first gate signal output from a first buffer corresponding to the third display area among the first buffers may be provided to the pixels disposed in the third display area.

In embodiments, the first frequency may be substantially equal to the third frequency.

In embodiments, the display panel may include a fourth display area, the fourth display area may be driven at a fourth frequency, a first buffer corresponding to the fourth display area among the first buffers may not output the first gate signal, and the first gate signal may not be provided to the pixels disposed in the fourth display area.

In embodiments, the second frequency may be substantially equal to the fourth frequency.

In embodiments, the pixels may be defined as first to $m^{th}$ pixel rows, the first display area may correspond to first to f pixel rows, among the first to $m^{th}$ pixel rows, where f is an integer between 1 and m and m is an integer greater than 1, the second display area may correspond to $(f+1)^{th}$ to $g^{th}$ pixel rows, among the first to $m^{th}$ pixel rows, where g is an integer between f+1 and m, the third display area may correspond to (g+1)th to $h^{th}$ pixel rows, among the first to $m^{th}$ pixel rows, where h is an integer between g+1 and m, and the fourth display area may correspond to (h+1)th to $m^{th}$ pixel rows among the first to $m^{th}$ pixel rows.

In embodiments, odd-numbered first buffers among the first buffers may receive a first buffer clock signal, even-numbered first buffers among the first buffers may receive a second buffer clock signal, and each of the first clock buffer signal and the second buffer clock signal may have a logic-low level in the first display area and the third display area, and may have a logic-high level in the second display area and the fourth display area.

In embodiments, the pixels may be defined as first to $m^{th}$ pixel rows, m being an integer greater than 1, a first stage corresponding to the first pixel row among the first stages may receive a first gate start signal as an input signal, and first stages corresponding to the second to $m^{th}$ pixel rows among the first stages may receive the first carry signals output from a previous first stage as input signals, respectively.

In embodiments, the display device may further include a second gate driver including second stages that output second carry signals, respectively, and second buffers that output second gate signals or third gate signals, respectively, and that provide the second gate signals and the third gate signals to the pixels.

In embodiments, the second gate signals and the third gate signals output from a second buffer corresponding to the first display area among the second buffers may be provided to the pixels disposed in the first display area. A second buffer corresponding to the second display area among the second buffers may not output the second gate signals and the third gate signals, and the second gate signals and the third gate signals may not be provided to the pixels disposed in the second display area.

In embodiments, the display panel may include a third display area, the third display area may be driven at a third frequency, and the second gate signals and the third gate signals output from a second buffer corresponding to the third display area among the second buffers may be provided to the pixels disposed in the third display area.

In embodiments, the first frequency may be substantially equal to the third frequency.

In embodiments, the display panel may include a fourth display area, the fourth display area may be driven at a fourth frequency. A second buffer corresponding to the fourth display area among the second buffers may not output the second gate signals and the third gate signals, and the second gate signals and the third gate signals may not be provided to the pixels disposed in the fourth display area.

In embodiments, the second frequency may be substantially equal to the fourth frequency.

In embodiments, odd-numbered second buffers among the second buffers may receive a first buffer power, even-numbered second buffers among the second buffers may receive a second buffer power, and each of the first buffer power and the second buffer power may have a logic-high level in the first display area and the third display area, and may have a logic-low level in the second display area and the fourth display area.

In embodiments, the pixels may be defined as first to $m^{th}$ pixel rows, m being an integer greater than 1, a second stage corresponding to the first pixel row among the second stages may receive a second gate start signal as an input signal, and second stages corresponding to the second to $m^{th}$ pixel rows among the second stages may receive the second carry signals output from a previous second stage as input signals, respectively.

Therefore, a display device according to embodiments may include a first gate driver and a second gate driver, so that even in case that numbers, positions, sizes, and the like of an area driven at a high frequency and an area driven at a low frequency are changed according to a selection of a user, a data write gate signal, a data initialization gate signal, and/or a compensation gate signal may not be provided to pixels disposed in a display area driven at the low frequency, and thus power consumption of the display device may be relatively reduced. Thus, various screen configurations of the display device can be implemented without substantially changing sizes of the first and second gate drivers, and the power consumption of the display device can be relatively reduced in case that the display device is driven with the screen configuration.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
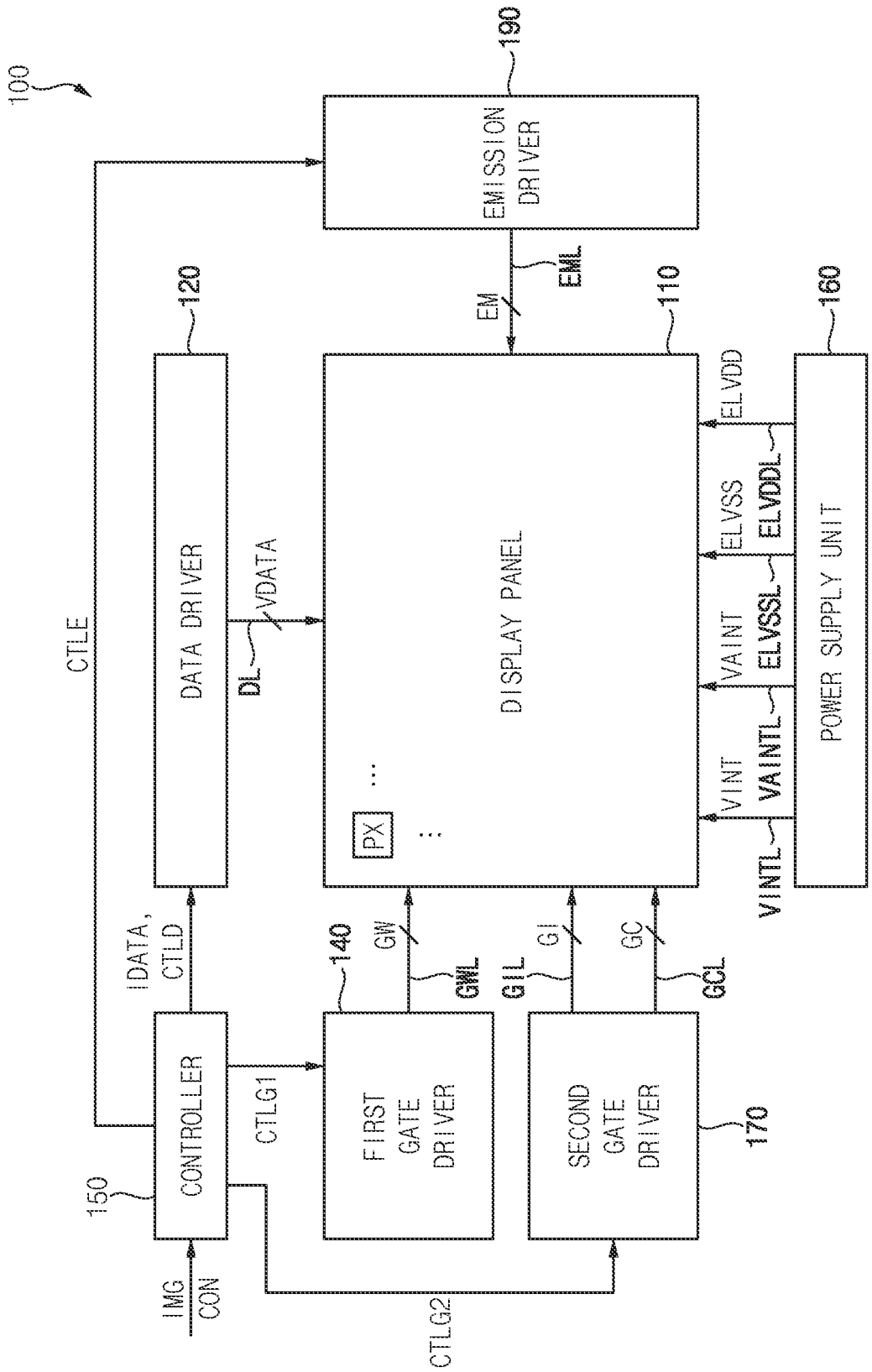
FIG. 1 is a block diagram illustrating a display device according to embodiments.

Hereinafter, embodiments will be explained in detail with reference to the accompanying drawings.

This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

Embodiments may be described and illustrated in the accompanying drawings in terms of functional blocks, units, and/or modules.

Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies.

In the case of the blocks, units, and/or modules being implemented by microprocessors or other similar hardware, they may be programmed and controlled using software (for example, microcode) to perform various functions discussed herein and may optionally be driven by firmware and/or software.

It is also contemplated that each block, unit, and/or module may be implemented by dedicated hardware, or as a combination of dedicated hardware to perform some functions and a processor (for example, one or more programmed microprocessors and associated circuitry) to perform other functions.

Each block, unit, and/or module of embodiments may be physically separated into two or more interacting and discrete blocks, units, and/or modules without departing from the scope of the disclosure.

Further, the blocks, units, and/or modules of embodiments may be physically combined into more complex blocks, units, and/or modules without departing from the scope of the disclosure.

FIG. 1 is a block diagram illustrating a display device according to embodiments.

Referring to FIG. 1, a display device 100 may include a display panel 110 including pixels PX, a controller 150, a data driver 120, a first gate driver 140, a second gate driver 170, an emission driver 190, a power supply unit 160, and the like within the spirit and the scope of the disclosure.

The display panel 110 may include data lines DL, data write gate lines GWL, data initialization gate lines GIL, compensation gate lines GCL, emission lines EML, first power supply voltage lines ELVDDL, second power supply voltage lines ELVSSL, first initialization voltage lines VINTL, second initialization voltage lines VAINTL, and pixels PX connected to the lines.

Each of the pixels PX may include at least five pixel transistors, at least one pixel capacitor, and a light emitting element, and the display panel 110 may be a light emitting display panel. According to embodiments, the display panel 110 may be a display panel of an organic light emitting display device (OLED). According to other embodiments, the display panel 110 may include a display panel of an inorganic light emitting display device (ILED), a display panel of a quantum dot display device (QDD), a display panel of a liquid crystal display device (LCD), a display panel of a field emission display device (FED), a display panel of a plasma display device (PDP), or a display panel of an electrophoretic display device (EPD).

The controller 150 (for example, a timing controller (T-CON)) may receive image data IMG and an input control signal CON from an external host processor (for example, an application processor (AP), graphic processing unit (GPU), or graphic card). The image data IMG may be RGB image data (or RGB pixel data) including red image data (or red pixel data), green image data (or green pixel data), and blue image data (or blue pixel data). The image data IMG may include information on a driving frequency. The control signal CON may include a vertical synchronization signal, a horizontal synchronization signal, an input data enable signal, a master clock signal, and the like, but embodiments are not limited thereto.

The controller 150 may convert the image data IMG into input image data DATA by applying an algorithm (for example, dynamic capacitance compensation (DCC), etc.) for correcting image quality to the image data IMG supplied from the external host processor. In an embodiment, in case that the controller 150 does not include an algorithm for improving image quality, the image data IMG may be output as the input image data IDATA. The controller 150 may supply the input image data IDATA to the data driver 120.

The controller 150 may generate a data control signal CTLD for controlling an operation of the data driver 120, a first gate control signal CTLG1 for controlling an operation of the first gate driver 140, a second gate control signal CTLG2 for controlling an operation of the second gate driver 170, and an emission control signal CTLE for controlling an operation of the emission driver 190 based on the input control signal CON. For example, the first and second gate control signals CTLG1 and CTLG2 may include first and second gate start signals, first and second clock signals, and the like, and the data control signal CTLD may include a horizontal start signal, a data clock signal, and the like within the spirit and the scope of the disclosure.

The first gate driver 140 may generate data write gate signals GW (for example, first gate signals) based on the first gate control signal CTLG1 received from the controller 150. The first gate driver 140 may output the data write gate signals GW to the pixels PX connected to the data write gate lines GWL, respectively.

The second gate driver 170 may generate data initialization gate signals GI (for example, second gate signals) and compensation gate signals GC (for example, third gate signals) based on the second gate control signal CTLG2 received from the controller 150. The second gate driver 170 may output the data initialization gate signals GI and the compensation gate signals GC to the pixels PX connected to the data initialization gate lines GIL and the compensation gate lines GCL, respectively.

The emission driver 190 may generate emission signals EM based on the emission control signal CTLE received from the controller 150. The emission driver 190 may output the emission signals EM to the pixels PX connected to the emission lines EML, respectively.

The power supply unit 160 may generate a first initialization voltage VINT, a second initialization voltage VAINT, a first power supply voltage ELVDD, and a second power supply voltage ELVSS, and may provide the first initialization voltage VINT, the second initialization voltage VAINT, the first power supply voltage ELVDD, and the second power supply voltage ELVSS to the pixels PX through the first initialization voltage line VINTL, the second initialization voltage line VAINTL, the first power supply voltage line ELVDDL, and the second power supply voltage line ELVSSL.

The data driver 120 may receive the data control signal CTLD and the input image data IDATA from the controller 150. The data driver 120 may convert digital input image data IDATA into an analog data voltage by using a gamma reference voltage generated by a gamma reference voltage generator (not shown). The analog data voltage obtained by the conversion will be defined as a data voltage VDATA. The data driver 120 may output data voltages VDATA to the pixels PX connected to the data lines DL based on the data control signal CTLD. According to other embodiments, the data driver 120 and the controller 150 may be implemented as a single integrated circuit, and such an integrated circuit may be referred to as a timing controller-embedded data driver (TED).

Figure 2:
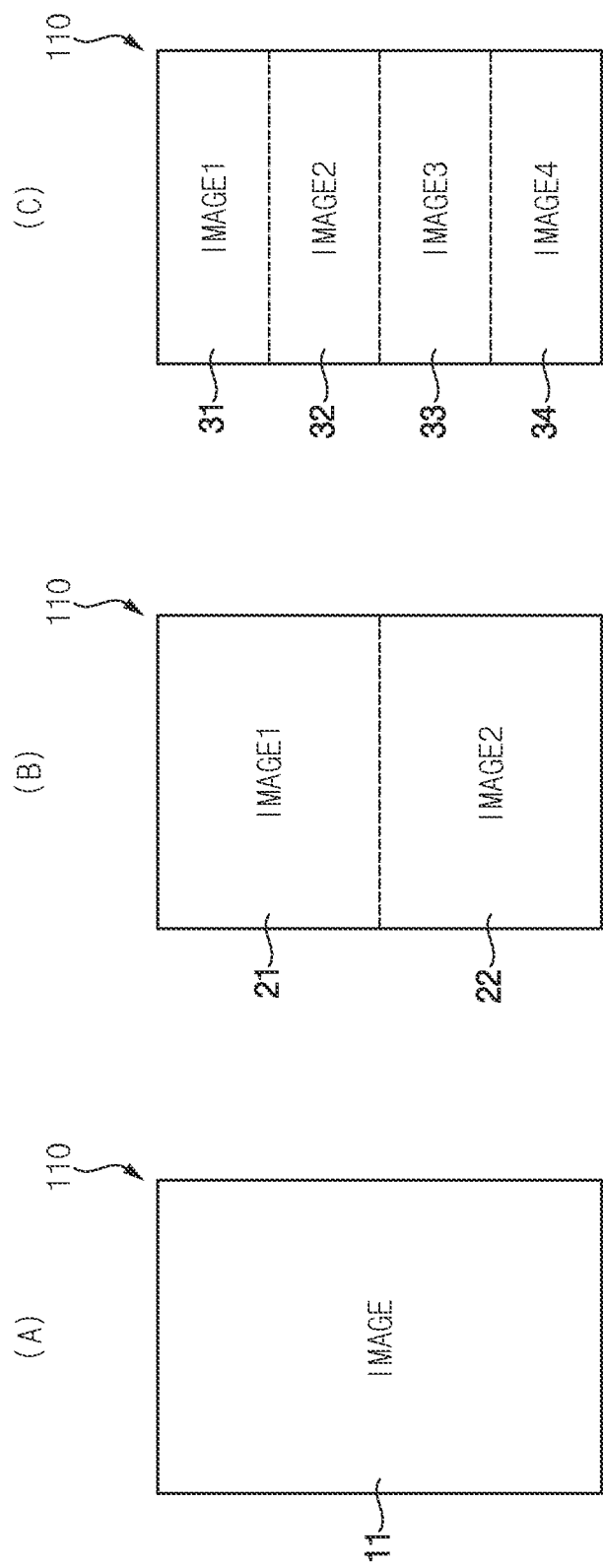
FIGS. 2A, 2B and 2C are block diagrams for describing a display area according to a method for driving the display device of FIG. 1.

FIGS. 2A, 2B and 2C are block diagrams for describing a display area according to a method for driving the display device of FIG. 1.

Referring to FIGS. 2A, 2B and 2C, the display device 100 may be driven at various driving frequencies. The information on the driving frequency may be included in the image data IMG. The display panel 110 may include the pixels PX, and the pixels PX may be defined as first to $m^{th}$ pixel rows (where m is an integer that is greater than or equal to 4).

In FIG. 2A, the display panel 110 included in the display device 100 may include a display area 11, and the pixels PX disposed in the display area 11 may be driven at a high frequency or a low frequency. In other words, the first to $m^{th}$ pixel rows may be driven at a high frequency or with a low frequency. For example, in case that the display panel 110 is driven at a high frequency, a moving image may be displayed in the display area 11. On the contrary, in case that the display panel 110 is driven at a low frequency, a still image (for example, a keyboard, a chat window, a text image, etc.) may be displayed in the display area 11. Driving at the high frequency may mean that the display panel 110 is driven at about 120 Hz (or about 100 HZ or more), and driving at the low frequency may mean that the display panel 110 is driven at about 10 Hz (or about 30 Hz or less).

In FIG. 2B, the display panel 110 may include a first display area 21 and a second display area 22. In other words, the display panel 110 may be divided into a first display area 21 and a second display area 22. For example, the pixels PX disposed in the first display area 21 may be driven at a high frequency, and the pixels PX disposed in the second display area 22 may be driven at a low frequency. In other words, the first display area 21 may correspond to first to $j^{th}$ pixel rows (where j is an integer between 1 and m) among the first to $m^{th}$ pixel rows, and the second display area 22 may correspond to $(j+1)^{th}$ to $m^{th}$ pixel rows among the first to $m^{th}$ pixel rows.

In FIG. 2C, the display panel 110 may include a first display area 31, a second display area 32, a third display area 33, and a fourth display area 34. In other words, the display panel 110 may be divided into a first display area 31, a second display area 32, a third display area 33, and a fourth display area 34. For example, the pixels PX disposed in each of the first display area 31 and the third display area 33 may be driven at a high frequency, and the pixels PX disposed in each of the second display area 32 and the fourth display area 34 may be driven at a low frequency. In other words, the first display area 31 may correspond to first to $f^{th}$ pixel rows (where f is an integer between 1 and m) among the first to $m^{th}$ pixel rows, the second display area 32 may correspond to $(f+1)^{th}$ to $g^{th}$ pixel rows (where g is an integer between f+1 and m) among the first to $m^{th}$ pixel rows, the third display area 33 may correspond to $(g+1)^{th}$ to $h^{th}$ pixel rows (where h is an integer between g+1 and m) among the first to $m^{th}$ pixel rows, and the fourth display area 34 may correspond to $(h+1)^{th}$ to $m^{th}$ pixel rows among the first to $m^{th}$ pixel rows.

According to a sample display device, a first display area driven at a high frequency and a second display area driven at a low frequency may be determined in case that the display device is manufactured, and a circuit configuration of a gate driver may be determined based on the first display area and the second display area. In other words, positions, sizes, and the like of the first display area and the second display area determined in case that the sample display device is manufactured may not be changed. For example, in case that numbers, positions, sizes, and the like of the first and second display areas are changed in the sample display device, a size of a gate driver may be relatively increased, and power consumption may be relatively increased.

According to embodiments, the display device 100 may include the first gate driver 140 and the second gate driver 170, so that even in case that numbers, positions, sizes, and the like of an area driven at a high frequency and an area driven at a low frequency are changed according to a selection of a user, the data write gate signal GW, the data initialization gate signal GI, and/or the compensation gate signal GC may not be provided to the pixels PX disposed in the display area driven at the low frequency, and thus power consumption of the display device 100 may be relatively reduced. Accordingly, various screen configuration of the display device 100 (for example, a screen configuration including at least one high-frequency area and at least one low-frequency area) may be implemented without substantially changing sizes of the first and second gate drivers 140 and 170, and the power consumption of the display device 100 may be relatively reduced in case that the display device 100 is driven with the screen configuration.

Figure 3:
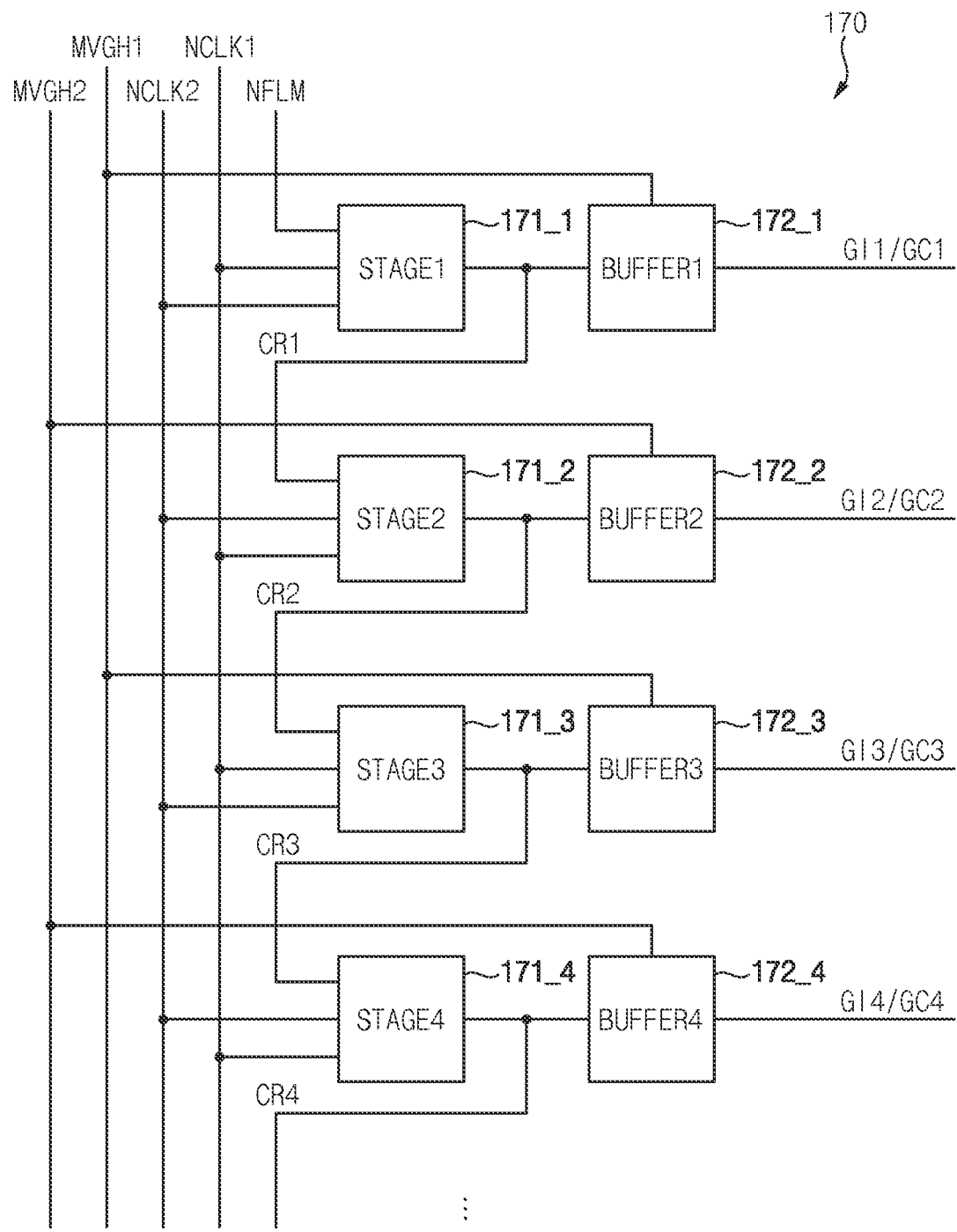
FIG. 3 is a block diagram illustrating a second gate driver included in the display device of FIG. 1.

FIG. 3 is a block diagram illustrating a second gate driver included in the display device of FIG. 1.

Referring to FIG. 3, the second gate driver 170 may include: stages 171_1, 171_2, 171_3, 171_4, . . . (for example, second stages) that output carry signals CR1, CR2, CR3, CR4, . . . (for example, second carry signals); and buffers 172_1, 172_2, 172_3, 172_4, . . . (for example, second buffers) that output data initialization gate signals GI1, GI2, GI3, GI4, . . . (for example, second gate signals) and compensation gate signals GC1, GC2, GC3, GC4, . . . (for example, third gate signals). According to embodiments, each of the buffers (for example, 172_1) may output an active-high gate signal for an N-type transistor (for example, an NMOS transistor).

The stages 171_1, 171_2, 171_3, 171_4, . . . may receive a second gate start signal NFLM and first and second clock signals NCLK1 and NCLK2. Among the stages 171_1, 171_2, 171_3, 171_4, . . . , a first stage 171_1 may receive the second gate start signal NFLM as an input signal, and the remaining stages 171_2, 171_3, 171_4, . . . may receive the carry signals CR1, CR2, CR3, CR4, . . . output from a previous stage as input signals.

The buffers 172_1, 172_2, 172_3, 172_4, . . . may receive a first buffer power MVGH1 and a second buffer power MVGH2. For example, odd-numbered buffers 172_1, 172_3, . . . may receive the first buffer power MVGH1, and even-numbered buffers 172_2, 172_4, . . . may receive the second buffer power MVGH2.

According to embodiments, the second gate driver 170 may selectively drive the buffers 172_1, 172_2, 172_3, 172_4, . . . based on the first buffer power MVGH1 and the second buffer power MVGH2, so that the data initialization gate signals GI1, GI2, GI3, GI4, . . . and the compensation gate signals GC1, GC2, GC3, GC4, . . . may be selectively output.

Figure 4:
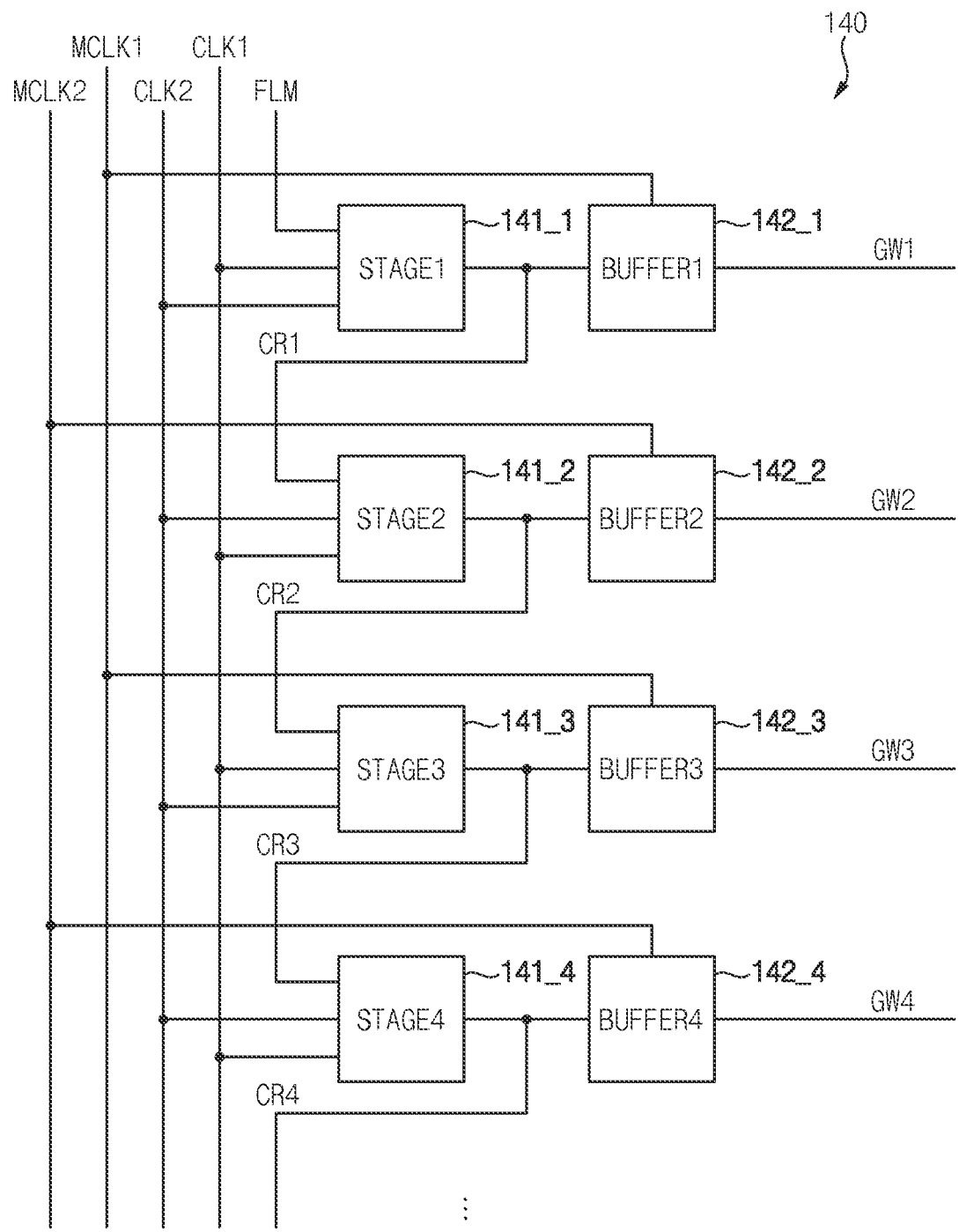
FIG. 4 is a block diagram illustrating a first gate driver included in the display device of FIG. 1.

FIG. 4 is a block diagram illustrating a first gate driver included in the display device of FIG. 1.

Referring to FIG. 4, the first gate driver 140 may include: stages 141_1, 141_2, 141_3, 141_4, . . . (for example, first stages) that output carry signals CR1, CR2, CR3, CR4, . . . (for example, first carry signals); and buffers 142_1, 142_2, 142_3, 142_4, . . . (for example, first buffers) that output data write gate signals GW1, GW2, GW3, GW4, . . . (for example, first gate signals). According to embodiments, each of the buffers (for example, 142_1) may output an active-low gate signal for a P-type transistor (for example, a PMOS transistor).

The stages 141_1, 141_2, 141_3, 141_4, . . . may receive a first gate start signal FLM and first and second clock signals CLK1 and CLK2. Among the stages 141_1, 141_2, 141_3, 141_4, . . . , a first stage 141_1 may receive the first gate start signal FLM as an input signal, and the remaining stages 141_2, 141_3, 141_4, . . . may receive the carry signals CR1, CR2, CR3, CR4, . . . output from a previous stage as input signals.

The buffers 142_1, 142_2, 142_3, 142_4, . . . may receive the first buffer clock signal MCLK1 and the second buffer clock signal MCLK2. For example, odd-numbered buffers 142_1, 142_3, . . . may receive the first buffer clock signal MCLK1, and even-numbered buffers 142_2, 142_4, . . . may receive the second buffer clock signal MCLK2.

According to embodiments, the first gate driver 140 may selectively drive the buffers 142_1, 142_2, 142_3, 142_4, . . . based on the first buffer clock signal MCLK1 and the second buffer clock signal MCLK2, so that the data write gate signals GW may be selectively output.

Figure 5:
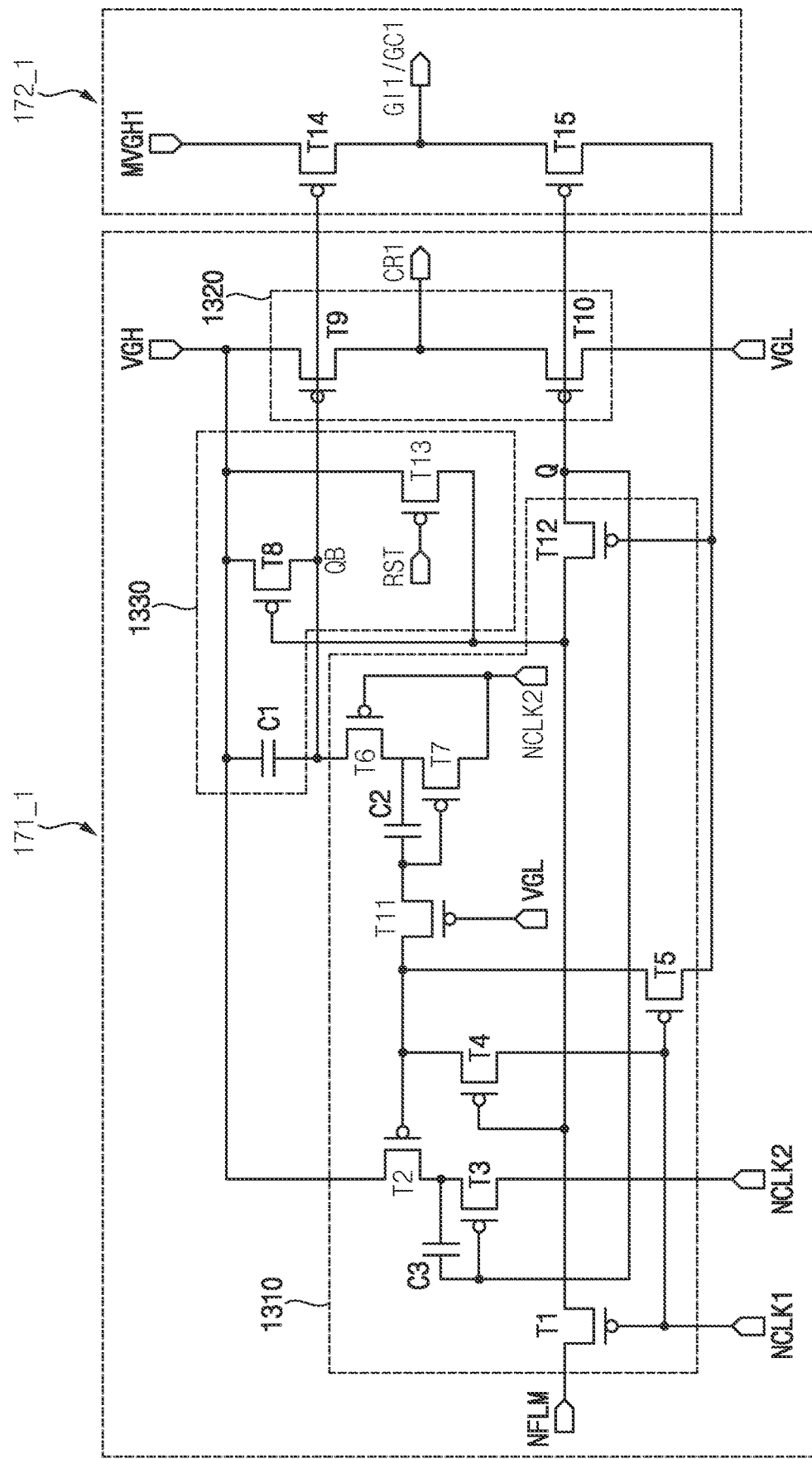
FIG. 5 is a circuit diagram illustrating a stage and a buffer included in the second gate driver of FIG. 3.

FIG. 5 is a circuit diagram illustrating a stage and a buffer included in the second gate driver of FIG. 3.

Referring to FIG. 5, the first stage 171_1 (for example, an odd-numbered stage) may include a node controller 1310, an outputter 1320, and a node maintainer 1330. The outputter 1320 may be connected to a first driving power VGH and a second driving power VGL, and the outputter 1320 may control a first carry signal CR1 based on a voltage of a second control node Q and a voltage of a first control node QB.

The outputter 1320 may include a ninth transistor T9 (or a pull-up transistor) and a tenth transistor T10 (or a pull-down transistor).

The ninth transistor T9 may include a first electrode connected to the first driving power VGH, a second electrode connected to a terminal through which the first carry signal CR1 is output, and a gate electrode connected to the first control node QB.

The tenth transistor T10 may include a first electrode connected to the terminal through which the first carry signal CR1 is output, a second electrode connected to the second driving power VGL, and a gate electrode connected to the second control node Q.

The node controller 1310 may be connected to the first driving power VGH, the second driving power VGL, an input terminal through which the second gate start signal NFLM is applied, a terminal through which the first clock signal NCLK1 is applied, and a terminal through which the second clock signal NCLK2 is applied. The node controller 1310 may control the voltage of the first control node QB and the voltage of the second control node Q by using the second gate start signal NFLM provided through the input terminal and the second driving power VGL.

The node controller 1310 may include first, second, third, fourth, fifth, sixth, seventh, eleventh, and twelfth transistors T1, T2, T3, T4, T5, T6, T7, T11, and T12, a second capacitor C2 (or a coupling capacitor), and a third capacitor C3.

The first transistor T1 may include a first electrode connected to the input terminal, a second electrode connected to a first electrode of the twelfth transistor T12, and a gate electrode connected to the terminal through which the first clock signal NCLK1 is applied.

The second transistor T2 may include a first electrode connected to a terminal through which the first driving power VGH is applied, a second electrode connected to a first electrode of the third transistor T3, and a gate electrode connected to a first electrode of the eleventh transistor T11.

The third transistor T3 may include a first electrode connected to the second electrode of the second transistor T2, a second electrode connected to the terminal through which the second clock signal NCLK2 is applied, and a gate electrode connected to the second control node Q.

The third capacitor C3 may be formed between the second electrode of the second transistor T2 and the second control node Q, and may include a first electrode connected to the second electrode of the second transistor T2 and a second electrode connected to the second control node Q.

The fourth transistor T4 may include a first electrode connected to the gate electrode of the second transistor T2, a second electrode connected to the terminal through which the first clock signal NCLK1 is applied, and a gate electrode connected to the second electrode of the first transistor T1.

The fifth transistor T5 may include a first electrode connected to the gate electrode of the second transistor T2, a second electrode connected to a terminal through which the second driving power VGL is applied, and a gate electrode connected to the terminal through which the first driving power VGH is applied.

The sixth transistor T6 may include a first electrode connected to the first control node QB, a second electrode connected to a first electrode of the seventh transistor T7, and a gate electrode connected to the terminal through which the second clock signal NCLK2 is applied.

The seventh transistor T7 may include a first electrode connected to the second electrode of the sixth transistor T6, a second electrode connected to the terminal through which the second clock signal NCLK2 is applied, and a gate electrode connected to a second electrode of the eleventh transistor T11.

The second capacitor C2 may be formed between the second electrode of the eleventh transistor T11 and the second electrode of the sixth transistor T6, and may include a first electrode connected to the second electrode of the eleventh transistor T11 and a second electrode connected to the second electrode of the sixth transistor T6.

The eleventh transistor T11 may include a first electrode connected to the gate electrode of the second transistor T2, a second electrode connected to the first electrode of the second capacitor C2, and a gate electrode connected to the terminal through which the second driving power VGL is applied.

The twelfth transistor T12 may include a first electrode connected to the second electrode of the first transistor T1, a second electrode connected to the second control node Q, and a gate electrode connected to the terminal through which the second driving power VGL is applied.

The node maintainer 1330 may constantly maintain the voltage of the first control node QB in response to the voltage of the second control node Q. The node maintainer 1330 may include a first capacitor C1, an eighth transistor T8, and a thirteenth transistor T13.

The first capacitor C1 may be formed between the terminal through which the first driving power VGH is applied and the first control node QB, and may include a first electrode connected to the terminal through which the first driving power VGH is applied and a second electrode connected to the first control node QB. The first capacitor C1 may constantly maintain a voltage difference between the terminals through which the first driving power VGH is applied and the first control node QB.

The eighth transistor T8 may include a first electrode connected to the terminal through which the first driving power VGH is applied, a second electrode connected to the first control node QB, and a gate electrode connected to the second electrode of the first transistor T1. The eighth transistor T8 may constantly maintain the voltage of the first control node QB in response to a voltage at the second electrode of the first transistor T1 (for example, the voltage of the second control node Q).

The thirteenth transistor T13 may include a first electrode connected to the terminal through which the first driving power VGH is applied, a second electrode connected to the second electrode of the first transistor T1, and a gate electrode connected to a terminal through which a reset signal RST is applied. In case that the display device 100 is turned on or off, the reset signal RST having a logic-low level may be applied.

Each of the first to thirteenth transistors T1, T2, . . . , and T13 may be a P-type transistor. Although the first to thirteenth transistors T1, T2, . . . , and T13 have been shown in FIG. 5 as being single-gate transistors, the configuration of the disclosure is not limited thereto. For example, in order to improve reliability, at least one of the first to thirteenth transistors T1, T2, . . . , and T13 may be implemented as a dual-gate transistor.

A first buffer 172_1 (for example, the odd-numbered buffer) may be connected to the first buffer power MVGH1 and the terminal through which the second driving power VGL is applied, and may output a first data initialization gate signal GI1 or a first compensation gate signal GC1 through an output terminal based on the voltage of the second control node Q and the voltage of the first control node QB. The first buffer 172_1 may include a fourteenth transistor T14 and a fifteenth transistor T15.

The fourteenth transistor T14 may include a first electrode connected to the first buffer power MVGH1, a second electrode connected to the output terminal through which the first data initialization gate signal GI1 or the first compensation gate signal GC1 is output, and a gate electrode connected to the first control node QB.

The fifteenth transistor T15 may include a first electrode connected to the output terminal through which the first data initialization gate signal GI1 or the first compensation gate signal GC1 is output, a second electrode connected to the second driving power VGL, and a gate electrode connected to the second control node Q.

Figure 6:
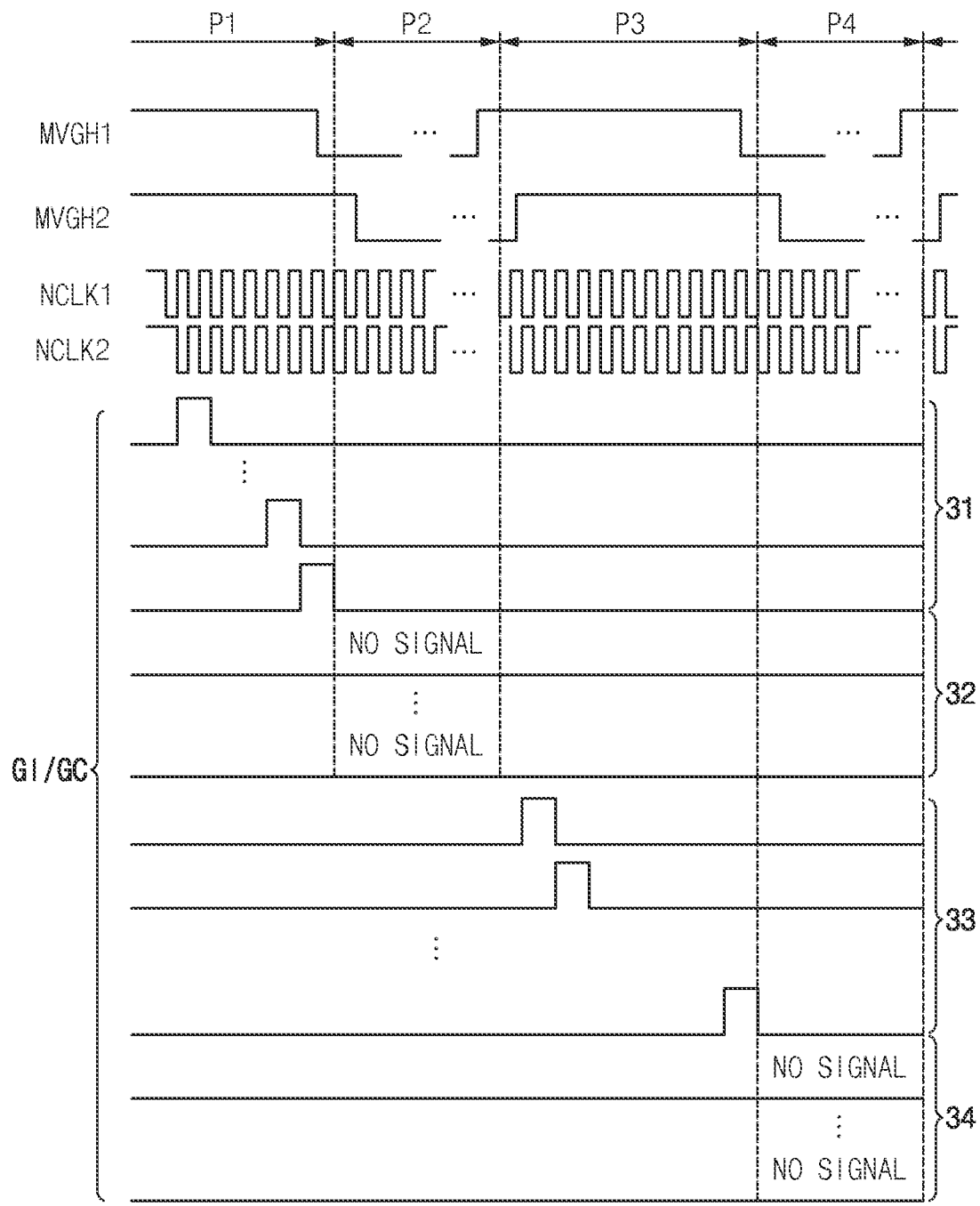
FIG. 6 is a timing diagram for describing operations of the stage and the buffer of FIG. 5.

FIG. 6 is a timing diagram for describing operations of the stage and the buffer of FIG. 5. For example, FIG. 6 shows driving of the second gate driver 170 in case that the display device 100 is driven with the first to fourth display areas 31, 32, 33, and 34 as shown in FIG. 2C.

Referring to FIGS. 2C, 5, and 6, the first buffer power MVGH1 provided to the odd-numbered buffers 172_1, 172_3, . . . and the second buffer power MVGH2 provided to the even-numbered buffers 172_2, 172_4, . . . may have a logic-high level in the first display area 31 driven at a high frequency (or a first period P1) and the third display area 33 driven at a high frequency (or a third period P3). As shown in FIG. 5, in case that the first buffer power MVGH1 has the logic-high level, the first data initialization gate signal GI1 or the first compensation gate signal GC1 may be output through the output terminal of the odd-numbered buffer 172_1. Similarly, in case that the second buffer power MVGH2 has the logic-high level, a second data initialization gate signal GI2 or a second compensation gate signal GC2 may be output through an output terminal of the even-numbered buffer 172_2.

The first buffer power MVGH1 provided to the odd-numbered buffers 172_1, 172_3, . . . and the second buffer power MVGH2 provided to the even-numbered buffers 172_2, 172_4, . . . may have a logic-low level in the second display area 32 driven at a low frequency (or a second period P2) and the fourth display area 34 driven at a low frequency (or a fourth period P1). As shown in FIG. 5, in case that the first buffer power MVGH1 has the logic-low level, a voltage level of the first buffer power MVGH1 and a voltage level of the second driving power VGL may be substantially equal to each other, and the first data initialization gate signal GI1 or the first compensation gate signal GC1 may not be output through the output terminal of the odd-numbered buffer 172_1. Similarly, in case that the second buffer power MVGH2 has the logic-low level, a voltage level of the second buffer power MVGH2 and the voltage level of the second driving power VGL may be substantially equal to each other, and the second data initialization gate signal GI2 or the second compensation gate signal GC2 may not be output through the output terminal of the even-numbered buffer 172_2.

In other words, although the carry signals CR1, CR2, CR3, CR4, . . . are output from the stages 171_1, 171_2, 171_3, 171_4, . . . , a buffer corresponding to a display area driven at a low frequency among the buffers 172_1, 172_2, 172_3, 172_4, . . . may not output the data initialization gate signal GI or the compensation gate signal GC.

Since the display device 100 according to embodiments may include the buffers 172_1, 172_2, 172_3, 172_4, . . . of the second gate driver 170, even in case that the carry signals CR1, CR2, CR3, CR4, . . . are all generated by the stages 171_1, 171_2, 171_3, 171_4, . . . , the buffers 172_1, 172_2, 172_3, 172_4, . . . may not output the data initialization gate signal among the data initialization gate signals GI1, GI2, GI3, GI4, . . . to the pixels PX disposed in an area in which the display panel 110 is driven at a low frequency, or may not output the compensation gate signal among the compensation gate signals GC1, GC2, GC3, GC4, . . . to the pixels PX disposed in the area in which the display panel 110 is driven at the low frequency. Accordingly, the power consumption of the display device 100 may be relatively reduced.

Since the odd-numbered buffers 172_1, 172_3, . . . receive the first buffer power MVGH1, and the even-numbered buffers 172_2, 172_4, . . . receive the second buffer power MVGH2, a phenomenon in which signals are distorted may be relatively reduced.

Furthermore, since the display device 100 changes timings of the first and second buffer powers MVGH1 and MVGH2 provided to the buffers 172_1, 172_2, 172_3, 172_4, . . . , even in case that numbers, positions, and sizes of a display area driven at a high frequency and a display area driven at a low frequency in the display panel 110 are changed, the data initialization gate signal GI or the compensation gate signal GC may not be output to the pixels PX disposed in the display area driven at the low frequency, which has been changed.

Figure 7:
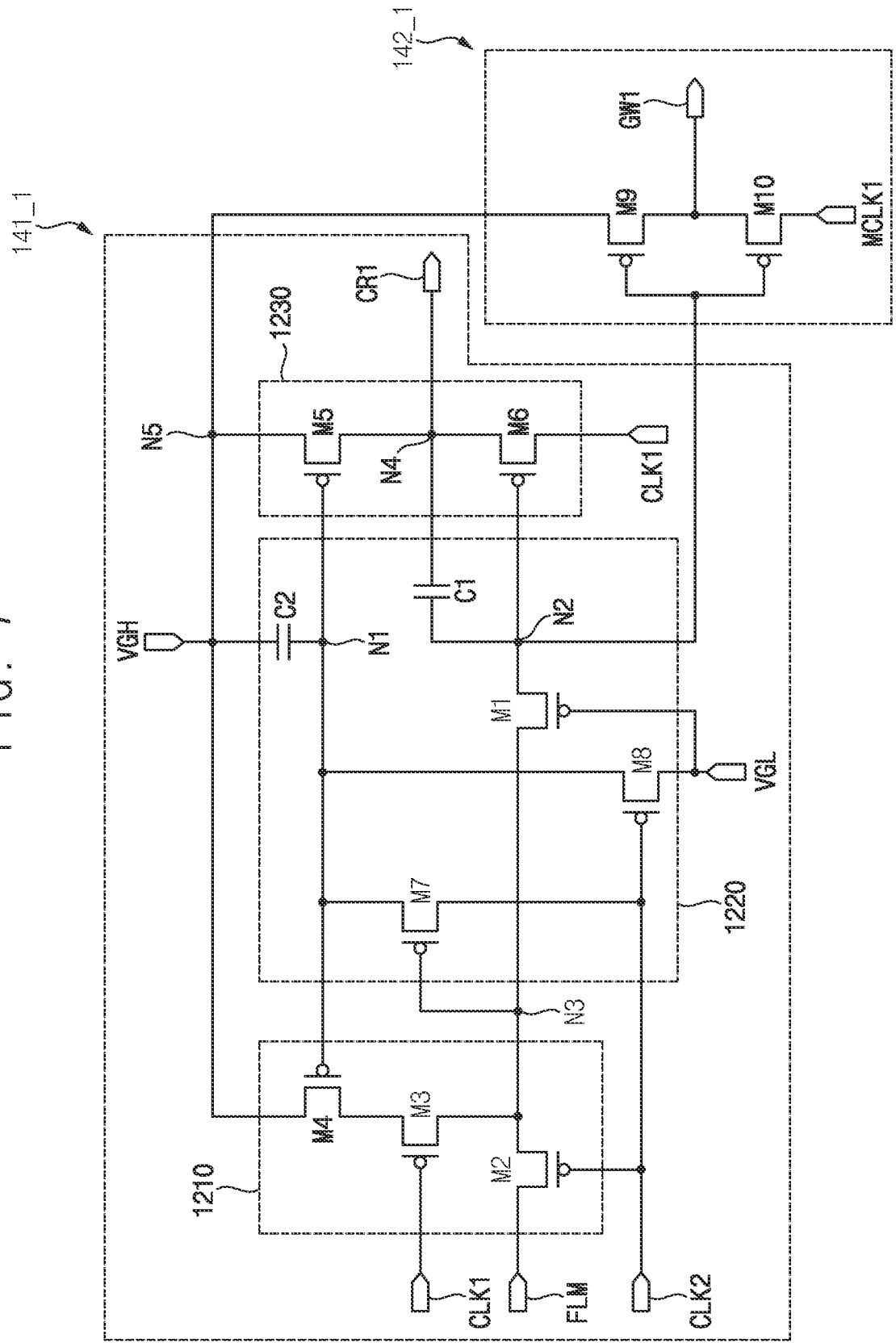
FIG. 7 is a circuit diagram illustrating a stage and a buffer included in the first gate driver of FIG. 4.

FIG. 7 is a circuit diagram illustrating a stage and a buffer included in the first gate driver of FIG. 4.

Referring to FIG. 7, the first stage 141_1 (for example, an odd-numbered stage) may include a first driver 1210, a second driver 1220, and an outputter 1230.

The outputter 1230 may include a fifth transistor M5 and a sixth transistor M6. The outputter 1230 may control the first carry signal CR1 supplied to an output terminal connected to a fourth node N4 based on a voltage of a first node N1 and a voltage of a second node N2. The fifth transistor M5 may be connected between a fifth node N5 to which the first driving power VGH is applied and the fourth node N4, and a gate electrode of the fifth transistor M5 may be connected to the first node N1. The fifth transistor M5 may control a connection between the first driving power VGH and the output terminal connected to the fourth node N4 based on the voltage applied to the first node N1. The sixth transistor M6 may be connected between the fourth node N4 and a terminal through which the first clock signal CLK1 is applied, and a gate electrode of the sixth transistor M6 may be connected to the second node N2. The sixth transistor M6 may control a connection between the terminal through which the first clock signal CLK1 is applied and the output terminal connected to the fourth node N4 based on the voltage applied to the second node N2.

The first driver 1210 may include a second transistor M2, a third transistor M3, and a fourth transistor M4. The first driver 1210 may control a voltage of a third node N3 based on the first clock signal CLK1 and the second clock signal CLK2. The second transistor M2 may be connected between a terminal through which the first gate start signal FLM is applied and the third node N3, and a gate electrode of the second transistor M2 may be connected to a terminal through which the second clock signal CLK2 is applied. The second transistor M2 may control a connection between the terminal through which the first gate start signal FLM is applied and the third node N3 based on the second clock signal CLK2. The third transistor M3 and the fourth transistor M4 may be connected in series between the third node N3 and the terminal through which the first driving power VGH is applied. The third transistor M3 may be connected between the fourth transistor M4 and the third node N3, and a gate electrode of the third transistor M3 may be connected to the terminal through which the first clock signal CLK1 is applied. The third transistor M3 may control a connection between the fourth transistor M4 and the third node N3 based on the first clock signal CLK1. The fourth transistor M4 may be connected between the third transistor M3 and the terminal through which the first driving power VGH is applied, and a gate electrode of the fourth transistor M4 may be connected to the first node N1. The fourth transistor M4 may control a connection between the third transistor M3 and the terminal through which the first driving power VGH is applied based on the voltage of the first node N1.

The second driver 1220 may include a first transistor M1, a seventh transistor M7, an eighth transistor M8, a first capacitor C1, and a second capacitor C2. The second driver 1220 may control the voltage of the first node N1 based on the second clock signal CLK2 and the voltage of the third node N3. The first capacitor C1 may be connected between the second node N2 and the fourth node N4. The first capacitor C1 may be charged with a voltage based on turning-on and turning-off of the sixth transistor M6. The second capacitor C2 may be connected between the first node N1 and the terminal through which the first driving power VGH is applied. The second capacitor C2 may charge the voltage applied to the first node N1. The seventh transistor M7 may be connected between the first node N1 and the terminal through which the second clock signal CLK2 is applied, and a gate electrode of the seventh transistor M7 may be connected to the third node N3. The seventh transistor M7 may control a connection between the first node N1 and the terminal through which the second clock signal CLK2 is applied based on the voltage of the third node N3. The eighth transistor M8 may be connected between the first node N1 and the terminal through which the second driving power VGL is applied, and a gate electrode of the eighth transistor M8 may be connected to the terminal through which the second clock signal CLK2 is applied. The eighth transistor M8 may control a connection between the first node N1 and the terminal through which the second driving power VGL is applied based on the second clock signal CLK2. The first transistor M1 may be connected between the third node N3 and the second node N2, and a gate electrode of the first transistor M1 may be connected to the terminal through which the second driving power VGL is applied. The first transistor M1 may control a connection between the third node N3 and the second node N2 based on the second driving power VGL.

A first buffer 142_1 (for example, the odd-numbered buffer) may be connected to the fifth node N5 to which the first driving power VGH is applied and a terminal through which the first buffer clock signal MCLK1 is applied, and may output a first data write gate signal GW1 through the output terminal based on the voltage of the first node N1 and the voltage of the second node N2. The first buffer 142_1 may include a ninth transistor M9 and a tenth transistor M10.

The ninth transistor M9 may include a first electrode connected to the fifth node N5 to which the first driving power VGH is applied, a second electrode connected to the output terminal through which the first data write gate signal GW1 is output, and a gate electrode connected to the first node N1.

The tenth transistor M10 may include a first electrode connected to the output terminal through which the first data write gate signal GW1 is output, a second electrode connected to the terminal through which the first buffer clock signal MCLK1 is applied, and a gate electrode connected to the second node N2.

Figure 8:
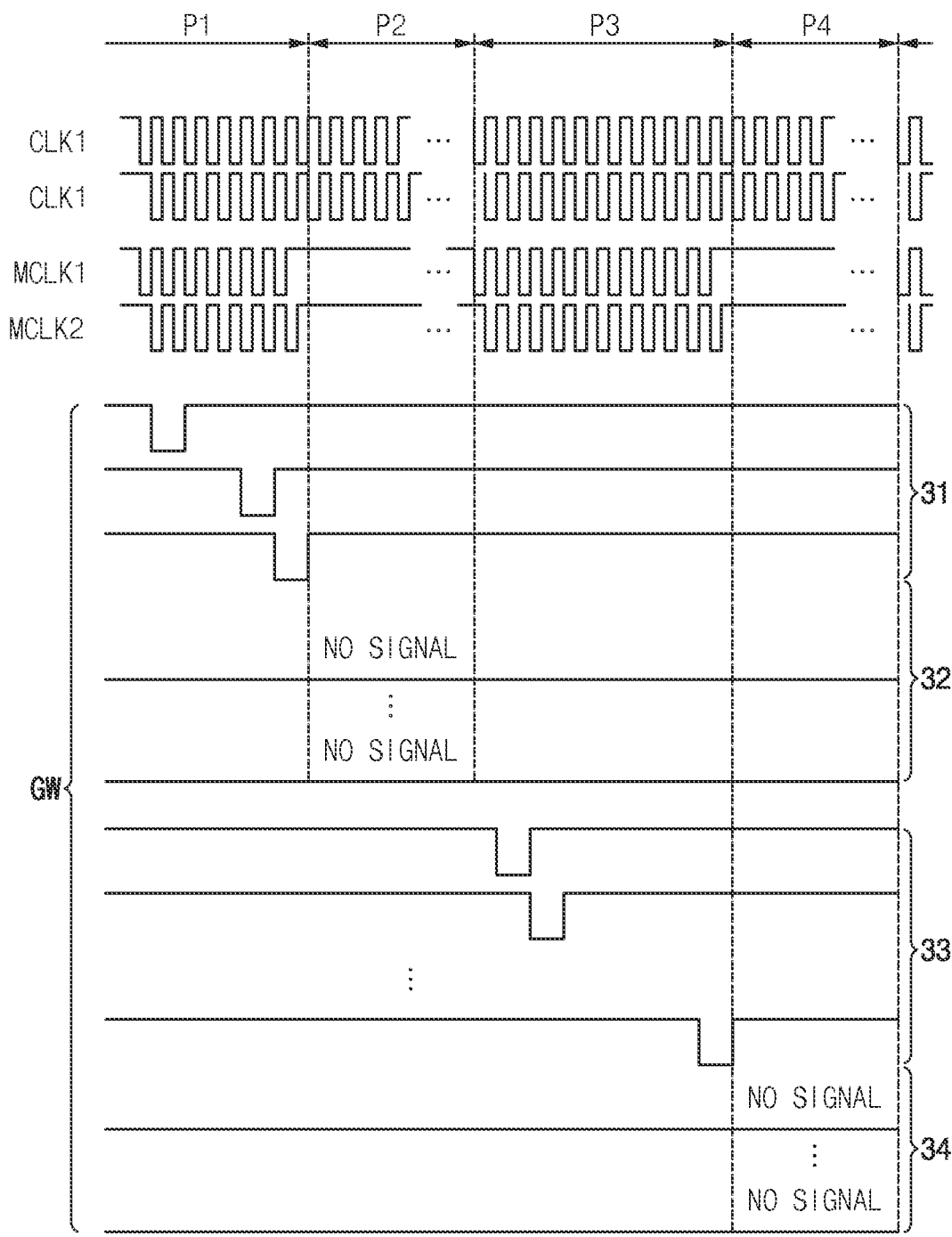
FIG. 8 is a timing diagram for describing an operation of the stage of FIG. 7.

FIG. 8 is a timing diagram for describing an operation of the stage of FIG. 7. For example, FIG. 8 shows driving of the first gate driver 140 in case that the display device 100 is driven with the first to fourth display areas 31, 32, 33, and 34 as shown in FIG. 2C.

Referring to FIGS. 2C, 7, and 8, the first buffer clock signal MCLK1 provided to the odd-numbered buffers 142_1, 142_3, . . . and the second buffer clock signal MCLK2 provided to the even-numbered buffers 142_2, 142_4, . . . may have a logic-low level in the first display area 31 driven at high frequency (or a first period P1) and the third display area 33 driven at a high frequency (or a third period P3). As shown in FIG. 7, in case that the first buffer clock signal MCLK1 has the logic-low level, the first data write gate signal GW1 may be output through the output terminal of the odd-numbered buffer 142_1. Similarly, in case that the second buffer clock signal MCLK2 has the logic-low level, a second data write gate signal GW2 may be output through an output terminal of the even-numbered buffer 142_2.

The first buffer clock signal MCLK1 provided to the odd-numbered buffers 142_1, 142_3, . . . and the second buffer clock signal MCLK2 provided to the even-numbered buffers 142_2, 142_4, . . . may have a logic-high level in the second display area 32 driven at a low frequency (or a second period P2) and the fourth display area 34 driven at a low frequency (or a fourth period P4). As shown in FIG. 7, in case that the first buffer clock signal MCLK1 has the logic-high level, a voltage level of the first buffer clock signal MCLK1 and a voltage level of the first driving power VGH may be substantially equal to each other, and the first data write gate signal GW1 may not be output through the output terminal of the odd-numbered buffer 142_1. Similarly, in case that the second buffer clock signal MCLK2 has the logic-high level, a voltage level of the second buffer clock signal MCLK2 and the voltage level of the first driving power VGH may be substantially equal to each other, and the second data write gate signal GW2 may not be output through the output terminal of the even-numbered buffer 142_2.

In other words, although the carry signals CR1, CR2, CR3, CR4, . . . are output from the stages 141_1, 141_2, 141_3, 141_4, . . . , a buffer corresponding to a display area driven at a low frequency among the buffers 142_1, 142_2, 142_3, 142_4, . . . may not output the data write gate signal GW.

Since the display device 100 according to embodiments may include the buffers 142_1, 142_2, 142_3, 142_4, . . . of the first gate driver 140, even in case that the carry signals CR1, CR2, CR3, CR4, . . . are all generated by the stages 141_1, 141_2, 141_3, 141_4, . . . , the buffers 142_1, 142_2, 142_3, 142_4, . . . may not output the data write gate signal GW among the data write gate signals GW1, GW2, GW3, GW4, . . . to the pixels PX disposed in an area in which the display panel 110 is driven at a low frequency. Accordingly, the power consumption of the display device 100 may be relatively reduced.

Since the odd-numbered buffers 142_1, 142_3, . . . receive the first buffer clock signal MCLK1, and the even-numbered buffers 142_2, 142_4, . . . receive the second buffer clock signal MCLK2, a phenomenon in which signals are distorted may be relatively reduced.

Furthermore, since the display device 100 changes timings of the first and second buffer clock signals MCLK1 and MCLK2 provided to the buffers 142_1, 142_2, 142_3, 142_4, . . . , even in case that numbers, positions, and sizes of a display area driven at a high frequency and a display area driven at a low frequency in the display panel 110 are changed, the data write gate signal GW may not be output to the pixels PX disposed in the display area driven at the low frequency, which has been changed.

Figure 9:
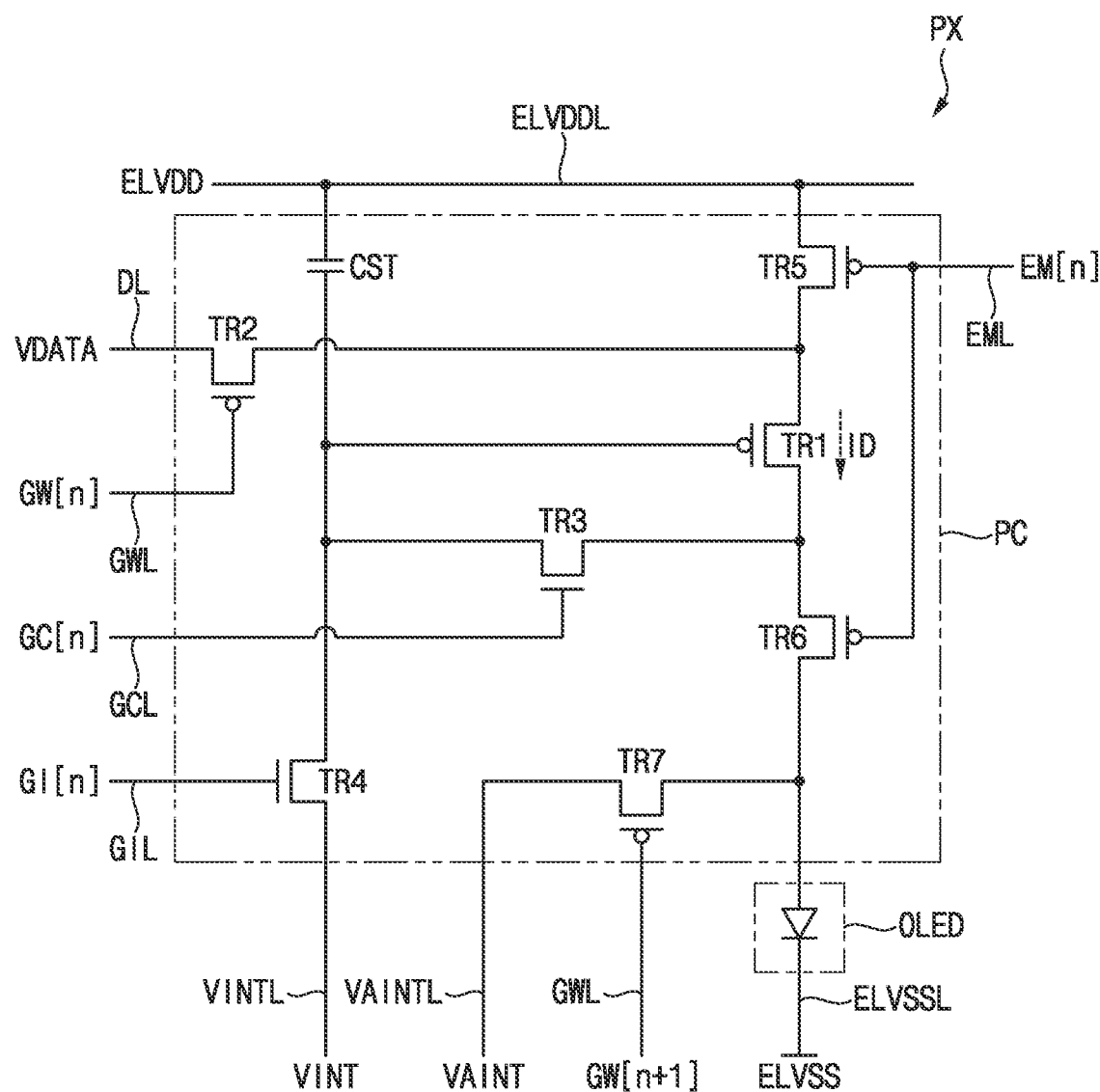
FIG. 9 is a circuit diagram illustrating a pixel included in the display device of FIG. 1.

FIG. 9 is a circuit diagram illustrating a pixel included in the display device of FIG. 1. For example, the pixels PX may be arranged or disposed along the first to $m^{th}$ pixel rows (where m is an integer that is greater than or equal to 4) in the display panel 110 included in the display device 100, and FIG. 9 shows a pixel PX[n] arranged or disposed in an $n^{th}$ pixel row (where n is an integer between 1 and m) among the first to $m^{th}$ pixel rows.

Referring to FIGS. 1 and 9, the display device 100 may include the pixel PX[n], and the pixel PX[n] may include a pixel circuit PC and an organic light emitting element OLED (or a light emitting element). The pixel circuit PC may include first to seventh pixel transistors TR1, TR2, TR3, TR4, TR5, TR6, and TR7, a pixel storage capacitor CST, and the like within the spirit and the scope of the disclosure. The pixel circuit PC or the organic light emitting element OLED may be connected to the first power supply voltage line ELVDDL, the second power supply voltage line ELVSSL, the first initialization voltage line VINTL, the second initialization voltage line VAINTL, the data line DL, data write gate lines GWL[n+1] and GWL[n], a data initialization gate line GIL[n], a compensation gate line GCL[n], and an emission line EML[n]. The first pixel transistor TR1 may correspond to a driving transistor, and the second to seventh pixel transistors TR2, TR3, TR4, TR5, TR6, and TR7 may correspond to switching transistors. Each of the first to seventh pixel transistors TR1, TR2, TR3, TR4, TR5, TR6, and TR7 may include a first terminal, a second terminal, and a gate terminal. According to embodiments, the first terminal may be a source terminal, and the second terminal may be a drain terminal. In an embodiment, the first terminal may be a drain terminal, and the second terminal may be a source terminal.

According to embodiments, each of the first, second, fifth, sixth, and seventh pixel transistors TR1, TR2, TR5, TR6, and TR7 may be a PMOS transistor, and may have a channel including polysilicon. Each of the third and fourth pixel transistors TR3 and TR4 may be an NMOS transistor, and may have a channel including a metal oxide semiconductor.

The organic light emitting element OLED may output a light based on a driving current ID. The organic light emitting element OLED may include a first terminal and a second terminal. According to embodiments, the first terminal of the organic light emitting element OLED may receive the first power supply voltage ELVDD, and the second terminal of the organic light emitting element OLED may receive the second power supply voltage ELVSS. The first power supply voltage ELVDD and the second power supply voltage ELVSS may be provided from the power supply unit 160 through the first power supply voltage line ELVDDL and the second power supply voltage line ELVSSL, respectively. For example, the first terminal of the organic light emitting element OLED may be an anode terminal, and the second terminal of the organic light emitting element OLED may be a cathode terminal. In an embodiment, the first terminal of the organic light emitting element OLED may be a cathode terminal, and the second terminal of the organic light emitting element OLED may be an anode terminal.

The first power supply voltage ELVDD may be applied to the first terminal of the first pixel transistor TR1. The second terminal of the first pixel transistor TR1 may be connected to the first terminal of the organic light emitting element OLED. The first initialization voltage VINT may be applied to the gate terminal of the first pixel transistor TR1. The first initialization voltage VINT may be provided from the power supply unit 160 through the first initialization voltage line VINTL.

The first pixel transistor TR1 may generate the driving current ID. According to embodiments, the first pixel transistor TR1 may operate in a saturation region. The first pixel transistor TR1 may generate the driving current ID based on a voltage difference between the gate terminal and the source terminal of the first pixel transistor TR1. Gray levels may be expressed based on a magnitude of the driving current ID supplied to the organic light emitting element OLED. In an embodiment, the first pixel transistor TR1 may operate in a linear region. The gray levels may be expressed based on a sum of a time during which the driving current is supplied to the organic light emitting element OLED within one frame.

The gate terminal of the second pixel transistor TR2 may receive a data write gate signal GW[n]. The data write gate signal GW[n] may be provided from the first gate driver 140 through the data write gate line GWL. The first terminal of the second pixel transistor TR2 may receive the data voltage VDATA. The data voltage VDATA may be provided from the data driver 120 through the data line DL. The second terminal of the second pixel transistor TR2 may be connected to the first terminal of the first pixel transistor TR1. The second pixel transistor TR2 may supply the data voltage VDATA to the source terminal of the first pixel transistor TR1 during an activation period of the data write gate signal GW[n]. The second pixel transistor TR2 may operate in a linear region.

The gate terminal of the third pixel transistor TR3 may receive a compensation gate signal GC[n]. The compensation gate signal GC[n] may be provided from the second gate driver 170 through the compensation gate line GCL. The first terminal of the third pixel transistor TR3 may be connected to the gate terminal of the first pixel transistor TR1. The second terminal of the third pixel transistor TR3 may be connected to the second terminal of the first pixel transistor TR1. In other words, the third pixel transistor TR3 may be connected between the gate terminal of the first pixel transistor TR1 and the second terminal of the first pixel transistor TR1.

The third pixel transistor TR3 may connect the gate terminal of the first pixel transistor TR1 to the second terminal of the first pixel transistor TR1 during an activation period of the compensation gate signal GC[n]. The third pixel transistor TR3 may operate in a linear region. For example, the third pixel transistor TR3 may diode-connect the first pixel transistor TR1 during the activation period of the compensation gate signal GC[n]. In other words, the third pixel transistor TR3 may diode-connect the first pixel transistor TR1 in response to the compensation gate signal GC[n]. Since the first pixel transistor TR1 is diode-connected, a voltage difference corresponding to a threshold voltage of the first pixel transistor TR1 may occur between the first terminal of the first pixel transistor TR1 and the gate terminal of the first pixel transistor TR1. The threshold voltage may have a negative value. As a result, a voltage obtained by summing up the data voltage VDATA supplied to the first terminal of the first pixel transistor TR1 and the voltage difference (for example, the threshold voltage) may be supplied to the gate terminal of the first pixel transistor TR1 during the activation period of the data write gate signal GW[n]. In other words, the data voltage VDATA may be compensated for by the threshold voltage of the first pixel transistor TR1, and the compensated data voltage VDATA may be supplied to the gate terminal of the first pixel transistor TR1.

The third pixel transistor TR3 may include an NMOS transistor, and the NMOS transistor may relatively reduce a leakage current. For example, in case that the leakage current is generated in the third pixel transistor TR3, a voltage of the gate terminal of the first pixel transistor TR1 may be increased, and the driving current ID may be decreased, so that a luminance may be reduced. Accordingly, in case that the display device 100 is driven at a low frequency, the third pixel transistor TR3 may be the NMOS transistor to reduce the leakage current of the third pixel transistor TR3 at a high gray level.

The gate terminal of the fourth pixel transistor TR4 may receive a data initialization gate signal GI[n]. The data initialization gate signal GI[n] may be provided from the second gate driver 170 through the data initialization gate line GIL. The first terminal of the fourth pixel transistor TR4 may receive the first initialization voltage VINT. The second terminal of the fourth pixel transistor TR4 may be connected to the gate terminal of the first pixel transistor TR1 (or the first terminal of the third pixel transistor TR3).

The fourth pixel transistor TR4 may supply the first initialization voltage VINT to the gate terminal of the first pixel transistor TR1 during an activation period of the data initialization gate signal GI[n]. The fourth pixel transistor TR4 may operate in a linear region. In other words, the fourth pixel transistor TR4 may initialize the gate terminal of the first pixel transistor TR1 to the first initialization voltage VINT during the activation period of the data initialization gate signal GI[n]. According to embodiments, the first initialization voltage VINT may have a voltage level that is sufficiently lower than a voltage level of the data voltage VDATA maintained by the pixel storage capacitor CST in a previous frame, and the first initialization voltage VINT may be supplied to the gate terminal of the first pixel transistor TR1. According to other embodiments, the first initialization voltage VINT may have a voltage level that is sufficiently higher than the voltage level of the data voltage VDATA maintained by the pixel storage capacitor CST in the previous frame, and the first initialization voltage VINT may be supplied to the gate terminal of the first pixel transistor TR1.

The fourth pixel transistor TR4 may include an NMOS transistor, and the NMOS transistor may relatively reduce a leakage current. For example, in case that the leakage current is generated in the fourth pixel transistor TR4, the voltage of the gate terminal of the first pixel transistor TR1 may be increased, and the driving current ID may be decreased, so that the luminance may be reduced. Accordingly, in case that the display device 100 is driven at a low frequency, the fourth pixel transistor TR4 may be the NMOS transistor to reduce the leakage current of the fourth pixel transistor TR4 at a high gray level.

The gate terminal of the fifth pixel transistor TR5 may receive an emission signal EM[n]. The emission signal EM[n] may be provided from the emission driver 190 through the emission line EML. The first terminal of the fifth pixel transistor TR5 may receive the first power supply voltage ELVDD. The second terminal of the fifth pixel transistor TR5 may be connected to the first terminal of the first pixel transistor TR1.

The fifth pixel transistor TR5 may supply the first power supply voltage ELVDD to the first terminal of the first pixel transistor TR1 during an activation period of the emission signal EM[n]. On the contrary, the fifth pixel transistor TR5 may cut off the supply of the first power supply voltage ELVDD during an inactivation period of the emission signal EM[n]. The fifth pixel transistor TR5 may operate in a linear region. Since the fifth pixel transistor TR5 supplies the first power supply voltage ELVDD to the first terminal of the first pixel transistor TR1 during the activation period of the emission signal EM[n], the first pixel transistor TR1 may generate the driving current ID. Since the fifth pixel transistor TR5 cuts off the supply of the first power supply voltage ELVDD during the inactivation period of the emission signal EM[n], the data voltage VDATA supplied to the first terminal of the first pixel transistor TR1 may be supplied to the gate terminal of the first pixel transistor TR1.

The gate terminal of the sixth pixel transistor TR6 may receive the emission signal EM[n]. The first terminal of the sixth pixel transistor TR6 may be connected to the second terminal of the first pixel transistor TR1. The second terminal of the sixth pixel transistor TR6 may be connected to the first terminal of the organic light emitting element OLED.

The sixth pixel transistor TR6 may supply the driving current ID generated by the first pixel transistor TR1 to the organic light emitting element OLED during the activation period of the emission signal EM[n]. The sixth pixel transistor TR6 may operate in a linear region. In other words, since the sixth pixel transistor TR6 supplies the driving current ID generated by the first pixel transistor TR1 to the organic light emitting element OLED during the activation period of the emission signal EM[n]. The organic light emitting element OLED may emit the light. Since the sixth pixel transistor TR6 electrically separates the first pixel transistor TR1 and the organic light emitting element OLED from each other during the inactivation period of the emission signal EM[n], the compensated data voltage VDATA supplied to the second terminal of the first pixel transistor TR1 may be supplied to the gate terminal of the first pixel transistor TR1.

The gate terminal of the seventh pixel transistor TR7 may receive a data write gate signal GW[n+1] provided to a pixel PX[n+1] arranged or disposed in an $(n+1)^{th}$ pixel row among the first to $m^{th}$ pixel rows. The data write gate signal GW[n+1] may be provided from the gate driver 140 through the data write gate line GWL. The first terminal of the seventh pixel transistor TR7 may receive the second initialization voltage VAINT. The second terminal of the seventh pixel transistor TR7 may be connected to the first terminal of the organic light emitting element OLED.

The seventh pixel transistor TR7 may supply the second initialization voltage VAINT to the first terminal of the organic light emitting element OLED during an activation period of the data write gate signal GW[n+1] provided to the pixel PX[n+1] arranged or disposed in the $(n+1)^{th}$ row. The seventh pixel transistor TR7 may operate in a linear region. In other words, the seventh pixel transistor TR7 may initialize the first terminal of the organic light emitting element OLED to the second initialization voltage VAINT during the activation period of the data write gate signal GW[n+1] provided to the pixel PX[n+1] arranged or disposed in the $(n+1)^{th}$ row. According to other embodiments, instead of the data write gate signal GW[n+1] provided to the pixel PX[n+1] arranged or disposed in the $(n+1)^{th}$ row, a data write gate signal GW[n−1] provided to a pixel PX[n−1] arranged or disposed in an $(n−1)^{th}$ pixel row among the first to $m^{th}$ pixel rows may be provided to the gate terminal of the seventh pixel transistor TR7.

The pixel storage capacitor CST may be connected between the first power supply voltage line ELVDDL and the gate terminal of the first pixel transistor TR1. The pixel storage capacitor CST may include a first terminal and a second terminal. For example, the first terminal of the pixel storage capacitor CST may receive the first power supply voltage ELVDD, and the second terminal of the pixel storage capacitor CST may be connected to the gate terminal of the first pixel transistor TR1.

The pixel storage capacitor CST may maintain a voltage level of the gate terminal of the first pixel transistor TR1 during an inactivation period of the data write gate signal GW[n]. The inactivation period of the data write gate signal GW[n] may include the activation period of the emission signal EM[n], and the driving current ID generated by the first pixel transistor TR1 may be supplied to the organic light emitting element OLED during the activation period of the emission signal EM[n]. Therefore, the driving current ID generated by the first pixel transistor TR1 may be supplied to the organic light emitting element OLED based on the voltage level maintained by the pixel storage capacitor CST.

However, although the pixel circuit PC according to the disclosure has been described as including one driving transistor, six switching transistors, and one storage capacitor, the configuration of the disclosure is not limited thereto. For example, the pixel circuit PC may have a configuration including at least one driving transistor, at least four switching transistors, and at least one storage capacitor.

Although the light emitting element included in the pixel PX according to the disclosure has been described as including the organic light emitting element OLED, the configuration of the disclosure is not limited thereto. For example, the light emitting element may include a quantum dot (QD) light emitting element, an inorganic light emitting diode, and the like within the spirit and the scope of the disclosure.

Figure 10:
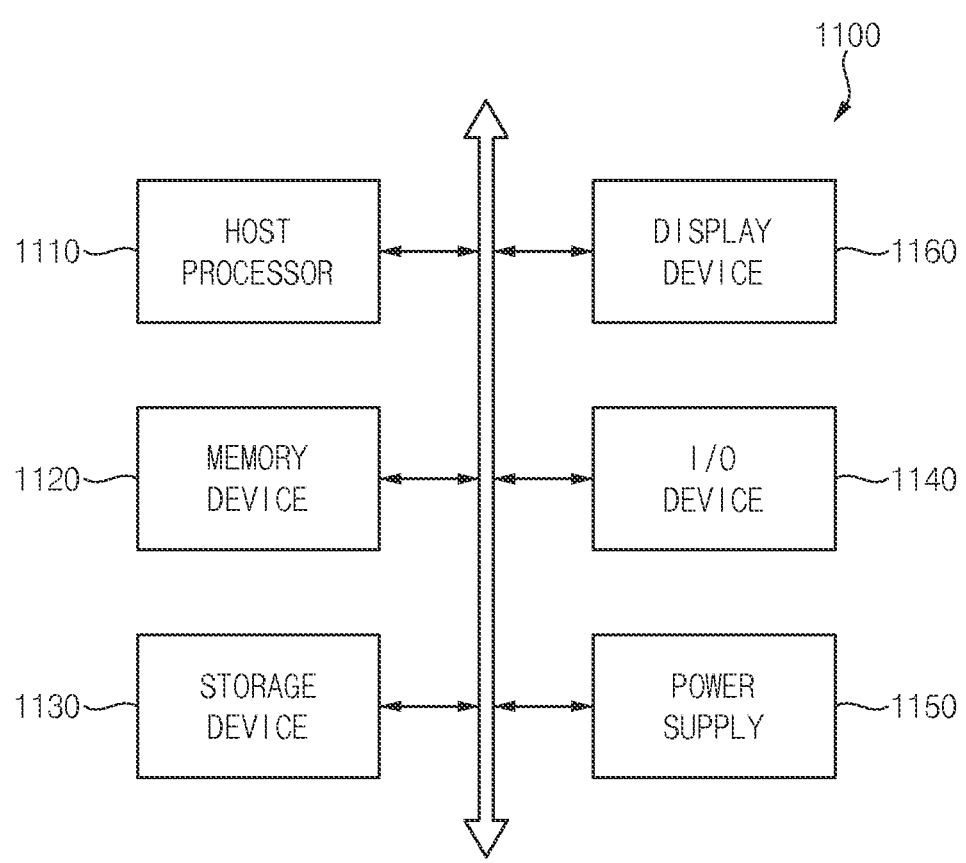
FIG. 10 is a block diagram illustrating an electronic device including a display device according to embodiments.

FIG. 10 is a block diagram illustrating an electronic device including a display device according to embodiments.

Referring to FIG. 10, the electronic device 1100 may include a host processor 1110, a memory device 1120, a storage device 1130, an input/output (I/O) device 1140, a power supply 1150, and a display device 1160. The electronic device 1100 may further include ports for communicating with a video card, a sound card, a memory card, a universal serial bus (USB) device, other electronic devices, for example.

The host processor 1110 may perform various computing functions. In an embodiment, the host processor 1110 may be a micro processor, a central processing unit (CPU), an application processor (AP), a graphic processing unit (GPU), for example. The host processor 1110 may be coupled to or connected to other components via an address bus, a control bus, a data bus, for example. Further, the host processor 1110 may be coupled to or connected to an extended bus such as a peripheral component interconnection (PCI) bus.

The memory device 1120 may store data for operations of the electronic device 1100.

For example, the memory device 1120 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device such as a dynamic random access memory (DRAM) device, a static random access memory (SRAM) device, a mobile DRAM device, for example.

The storage device 1130 may include a solid state drive (SSD) device, a hard disk drive (HDD) device, a CD-ROM device, for example. The I/O device 1140 may include an input device such as a keyboard, a keypad, a mouse device, a touchpad, a touch-screen, etc. and an output device such as a printer, a speaker, for example. The power supply 1150 may provide power for operations of the electronic device 1100. The display device 1160 may be coupled to or connected to other components via the buses and/or other communication links.

The display device 1160 may include a display panel including pixels, a controller, a data driver, a first gate driver, a second gate driver, an emission driver, a power supply unit, and the like within the spirit and the scope of the disclosure. The first gate driver may include stages that output carry signals, and buffers that output data write gate signals. The second gate driver may include stages that output carry signals, and buffers that output data initialization gate signals and compensation gate signals. According to embodiments, since the display device 1160 may include the buffers of the first and second gate drivers, even in case that the carry signals are all generated by the stages, the buffers may selectively output the data write gate signals, the data initialization gate signals, and the compensation gate signals. Accordingly, power consumption of the display device 1160 may be relatively reduced.

In an embodiment, the electronic device 1100 may be an electronic device including the display device 1160, such as a mobile phone, a smart phone, a tablet computer, a digital television (TV), a 3D TV, a virtual reality (VR) device, a personal computer, a household electronic device, a laptop computer, a personal digital assistant, a portable multimedia player, a digital camera, a music player, a portable game console, or a navigation device.

Although embodiments have been described above, it will be understood by those of ordinary skill in the art that various changes and modifications can be made to the disclosure without departing from the spirit and scope of the disclosure and as set forth in the appended claims.

The disclosure may be applied to various electronic devices that may include a display device. For example, the disclosure may be applied to numerous electronic devices such as vehicle display devices, ship display devices, aircraft display devices, portable communication devices, exhibition display devices, information transmission display devices, and medical display devices.

What is claimed is:

1. A display device comprising:
    a display panel including pixels, the display panel also including a first display area and a second display area with the first display area being driven at a first frequency and the second display area being driven at a second frequency lower than the first frequency;
    a first gate driver including first stages that output respective first carry signals; and
    first buffers each coupled to a respective first stage, that output respective first gate signals, and that provide the respective first gate signals to the pixels, wherein
    a first gate signal among the first gate signals output from a first buffer corresponding to the first display area among the first buffers is provided to the pixels disposed in the first display area,
    a first buffer corresponding to the second display area among the first buffers does not output the first gate signal such that the first gate signal is not provided to the pixels disposed in the second display area,
    at least one first buffer of the first buffers for the first display area receives a buffer clock signal having a logic-low level while simultaneously at least another first buffer of the first buffers for the second display area receives a buffer clock signal having a logic-high level, and
    the logic high level of the buffer clock signal is substantially equal to a voltage level of a first driving power, and the logic low level of the buffer clock signal is substantially equal to a voltage level of a second driving power lower than the first driving power.

2. The display device of claim 1, wherein a size or a position of each of the first display area and the second display area is changeable.

3. The display device of claim 1, wherein
    the first frequency is greater than or substantially equal to about 100 Hz, and
    the second frequency is less than or substantially equal to about 30 Hz.

4. The display device of claim 1, wherein
    the pixels are defined as first to $m^{th}$ pixel rows,
    the first display area corresponds to first to $j^{th}$ pixel rows, among the first to $m^{th}$ pixel rows, and
    the second display area corresponds to $(j+1)^{th}$ to $m^{th}$ pixel rows among the first to $m^{th}$ pixel rows, wherein
    j is an integer between 1 and m, and
    m is an integer greater than 1.

5. The display device of claim 1, wherein
    the display panel includes a third display area,
    the third display area is driven at a third frequency, and
    the first gate signal output from a first buffer corresponding to the third display area among the first buffers is provided to the pixels disposed in the third display area.

6. The display device of claim 5, wherein the first frequency is substantially equal to the third frequency.

7. The display device of claim 5, wherein
    the display panel includes a fourth display area,
    the fourth display area is driven at a fourth frequency,
    a first buffer corresponding to the fourth display area among the first buffers does not output the first gate signal, and
    the first gate signal is not provided to the pixels disposed in the fourth display area.

8. The display device of claim 7, wherein the second frequency is substantially equal to the fourth frequency.

9. The display device of claim 7, wherein
    the pixels are defined as first to $m^{th}$ pixel rows,
    the first display area corresponds to first to $f^{th}$ pixel rows, among the first to $m^{th}$ pixel rows, where f is an integer between 1 and m, and m is an integer greater than 1, the second display area corresponds to (f+1)$^{th}$ to g$^{th}$ pixel rows, among the first to m$^{th}$ pixel rows, where g is an integer between f+1 and m, the third display area corresponds to (g+1)$^{th}$ to h$^{th}$ pixel rows, among the first to m$^{th}$ pixel rows where h is an integer between g+1 and m, and the fourth display area corresponds to (h+1)$^{th}$ to m$^{th}$ pixel rows among the first to m$^{th}$ pixel rows.

10. The display device of claim 7, wherein
odd-numbered first buffers among the first buffer receive a first buffer clock signal,
even-numbered first buffers among the first buffers receive a second buffer clock signal, and
each of the first buffer clock signal and the second buffer clock signal partially has a logic-low level in the first display area and the third display area, and simultaneously has a logic-high level in the second display area and the fourth display area.

11. The display device of claim 1, wherein
the pixels are defined as first to m$^{th}$ pixel rows, m being an integer greater than 1,
a first stage corresponding to the first pixel row among the first stages receives a first gate start signal as an input signal, and
first stages corresponding to the second to m$^{th}$ pixel rows among the first stages receive the first carry signals output from a previous first stage as input signals, respectively.

12. The display device of claim 1, further comprising:
a second gate driver including second stages that output respective second carry signals, and second buffers that output respective second gate signals or third gate signals, and that provide the second gate signals and the third gate signals to the pixels.

13. The display device of claim 12, wherein
the second gate signals and the third gate signals output from a second buffer corresponding to the first display area among the second buffers are provided to the pixels disposed in the first display area,
a second buffer corresponding to the second display area among the second buffers does not output the second gate signals and the third gate signals, and
the second gate signals and the third gate signals are not provided to the pixels disposed in the second display area.

14. The display device of claim 13, wherein
the display panel includes a third display area,
the third display area is driven at a third frequency, and
the second gate signals and the third gate signals output from a second buffer corresponding to the third display area among the second buffers are provided to the pixels disposed in the third display area.

15. The display device of claim 14, wherein the first frequency is substantially equal to the third frequency.

16. The display device of claim 14, wherein
the display panel includes a fourth display area,
the fourth display area is driven at a fourth frequency,
a second buffer corresponding to the fourth display area among the second buffers does not output the second gate signals and the third gate signals, and
the second gate signals and the third gate signals are not provided to the pixels disposed in the fourth display area.

17. The display device of claim 16, wherein the second frequency is substantially equal to the fourth frequency.

18. The display device of claim 16, wherein
odd-numbered second buffers among the second buffers receive a first buffer power,
n even-numbered second buffers among the second buffers receive a second buffer power, and
each of the first buffer power and the second buffer power has a logic-high level in the first display area and the third display area, and has a logic-low level in the second display area and the fourth display area.

19. The display device of claim 12, wherein
the pixels are defined as first to m$^{th}$ pixel rows, m being an integer greater than 1,
a second stage corresponding to the first pixel row among the second stages receives a second gate start signal as an input signal, and
second stages corresponding to the second to m$^{th}$ pixel rows among the second stages receive respective second carry signals output from a previous second stage as input signals.

* * * * *